United States Patent [19]

Facoetti et al.

[11] 4,403,382
[45] Sep. 13, 1983

[54] PROCESS FOR MANUFACTURING ELECTROMECHANICAL TRANSDUCERS USING AT LEAST ONE POLYMER FILM

[75] Inventors: Hugues Facoetti; Patrick Petit; Philippe Menoret; Francois Micheron; Pierre Ravinet, all of Paris, France

[73] Assignee: Thomson-CSF, Paris, France

[21] Appl. No.: 239,643

[22] Filed: Mar. 2, 1981

[30] Foreign Application Priority Data

Mar. 4, 1980 [FR] France .................. 80 04832

[51] Int. Cl.³ .................................... H04R 17/00
[52] U.S. Cl. .................................... 29/25.35; 264/22; 310/357; 310/800
[58] Field of Search .................. 29/592 E, 25.35; 427/100; 361/233; 264/22; 310/800, 357

[56] References Cited

U.S. PATENT DOCUMENTS 3,816,774  6/1974  Ohnuki et al. .................. 310/8.6
4,284,921  8/1981  Lemonon et al. ................ 310/800
4,346,505  8/1982  Lemonon et al. ................ 29/25.35

OTHER PUBLICATIONS

Micheron, F. & Lemonon, C., J. Acoust. Soc. Am. 64(c), "Moulded Piezoelectric Transducers Using Polar Polymers", Dec. 1978, p. 1720.

Primary Examiner—Carl E. Hall
Assistant Examiner—P. W. Echols
Attorney, Agent, or Firm—Cushman, Darby & Cushman

[57] ABSTRACT

The invention relates to the manufacture of electromechanical transducers with at least one element made from a polymer material shaped and polarized so as to obtain an active self-supporting structure having a non-developable surface and to a manufacturing process which consists in shaping a structure already coated with metalizations, so that the electric polarizing field may be applied to the structure during shaping and until return thereof to ambient temperature.

8 Claims, 8 Drawing Figures

PROCESS FOR MANUFACTURING ELECTROMECHANICAL TRANSDUCERS USING AT LEAST ONE POLYMER FILM

BACKGROUND OF THE INVENTION

The invention relates to the manufacture of transducers such as microphones, earphones, loudspeakers, probes for echography, hydrophones, etc. which comprise at least one active element comprising a polymer film fitted with electrodes. It relates more particularly to transducers in which one or more polymer films are shaped by thermoforming and/or electroforming, so as to obtain a self-supporting structure such as a dome, cone, etc. These shapes correspond to nondevelopable surfaces which are generally obtained from a simple or composite structure whose faces are metalized after shaping. In the case where the shaping generates considerable stretching of the polymer, for example during shaping of a flat film so as to obtain a self-supporting protuberance in the form of a spherical skullcap, there is established a mechanical anisotropy such that the shape obtained may tend to shrivel during subsequent metalization and polarization operations, which involve heating of the polymer. To get around this disadvantage, several molds are used for maintaining unchanged the shape obtained in all the steps of the process, which complicates the manufacturing equipment.

When the shaped polymer structure is to be provided on each face with electrodes which define adjacent active zones, difficulties are met with masking the zones surrounding these electrodes. In fact, the complex shape of the structure causes the patterns of the mask to be projected with distortions or, due to the existence of shadow zones, the masking introduces unacceptable electrode discontinuities.

SUMMARY OF THE INVENTION

To get around these difficulties, the invention provides shaping of a flat film already coated with its metalizations. The shaping then combines the stretching, heating and electric polarization actions, and the previous fitting of the metalizations on the flat structure to be shaped simplifies the accurate delimitation of the electrodes. For such a process to be applicable, the stretching of the metalizations must generate no gap in the electrodes and in their connections and the residual tensions after shaping must not create mechanical instability of the self-supporting structure.

The invention provides a process for manufacturing electromechanical transducers using at least one polymer film which is subjected to shaping so that the structure obtained is self-supporting and nondevelopable, this structure being provided with electrodes on both faces thereof, consisting in providing the two faces of the flat structure comprising this film with similar metalizations intended to form these electrodes and in shaping this structure by applying an electrical polarizing voltage to the metalizations; this shaping being obtained under the action of a mechanical stress permanently increasing the surface of the metalizations carried by this structure.

The invention also provides a device for implementing this manufacturing process and comprising a punch associated with means in alignment with the punch for peripheral clamping of the flat zone of the polymer structure to be shaped, wherein the electrical polarization of the polymer structure is provided while shaping by electrical connections established between the metalizations contained in said flat zone, the punch and the peripheral clamping means.

DESCRIPTION OF THE DRAWINGS

The invention will be better understood from the following description and the accompanying figures in which.

DESCRIPTION OF THE PREFERRED EMBODIMENTS

The shaping process of the invention applies to any lamellar structure comprising at least one polymer film enclosed by two metal deposits. A linear and reversible electromechanical transducer effect may be induced by creating in the polymer film a permanent electrical anisotropy. This anisotropy may be obtained by the creation of an excess charge or by dipolar orientation of the macromolecular chains in the presence of a very strong transverse electrical field. The technique of dipolar orientation allows a piezoelectric effect to be induced in polar homopolymers such as vinylidene polyfluoride ($PVF_2$), vinyl polyfluoride (PVF) and vinyl polychloride (PVC) as well as in polar copolymers such as the copolymer of vinylidene polyfluoride and ethylene polytetrafluoride ($PVF_2$-PTFE).

The technique consisting in inducing an excess charge in a polymer such as ethylene polytetrafluoride uses the application, when heated, of an intense electric field. The transducer effect results then from the electrostatic forces brought into play and from the linearizing action of the induced excess charge. Dimorphous structures may be formed by causing two films to adhere to one another so as to obtain deformation by bending.

So as to simplify the following description, the case of a structure has been considered by way of nonlimiting example comprising a film of polar polymer such as $PVF_2$, the two faces of which have received metalization by thermal evaporation.

Figure 1:
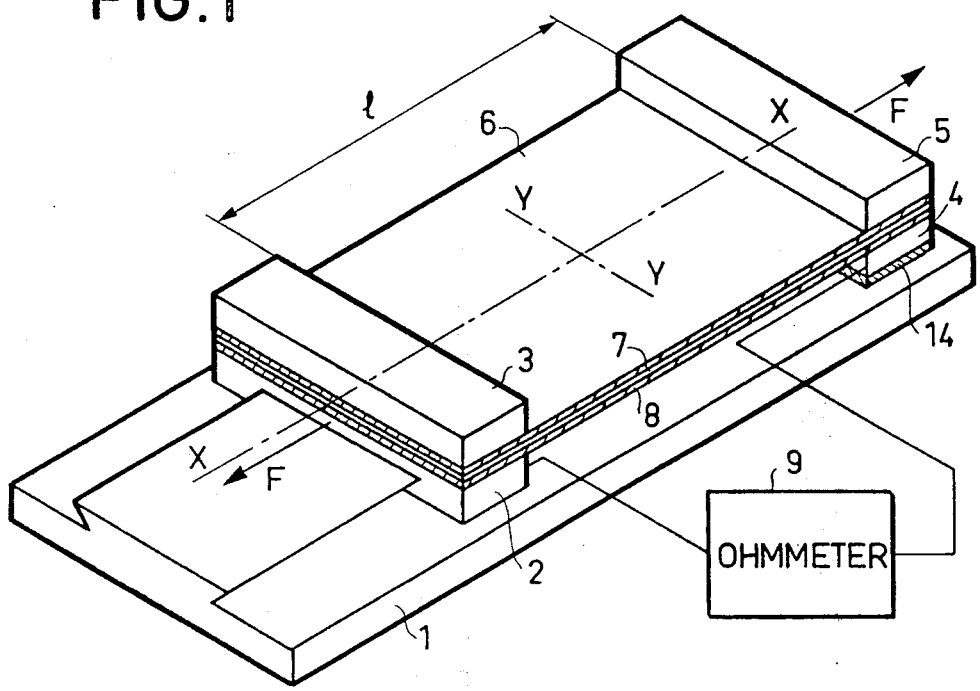
FIG. 1 is an isometric view of apparatus for measuring the electrical resistance of a metalization subjected to stretching.

The apparatus shown in FIG. 1 serves for stretching a polymer film metalized on both its faces for revealing the aptitude of metalizations to retain their conducting qualities and their adherence during plastic deformation. The apparatus of FIG. 1 comprises a prismatic bench 1 with axis XX carrying a fixed support 4 electrically insulated by means of a sole-piece 14. A mobile support 2 slides along bench 1. Two clamping plates 3 and 5 cooperate with supports 2 and 4 so as to firmly clamp the ends of a tensile test-piece rectangular in shape. This latter is formed by a film of polymer material 7 to the faces of which adhere similar metalizations 6 and 8. An ohmmeter 9 is connected between the conducting masses 2 and 4 so as to measure the electric resistance of metalization 8.

At the beginning of the tensile test, structure 6, 7, 8 is simply tightened and ohmmeter 9 supplies the measurement R of the initial resistance of layer 8 between two parallel contact lines spaced apart by 1. Then separating forces F are applied to supports 2 and 4 so as to create an elongation $\Delta l$ to which corresponds an increase $\Delta R$ of the resistance measured. By causing elongation $\Delta l$ to increase by discrete values, the corresponding increases $\Delta R$ in the electrical resistance of metalization 8 are noted.

Figure 2:
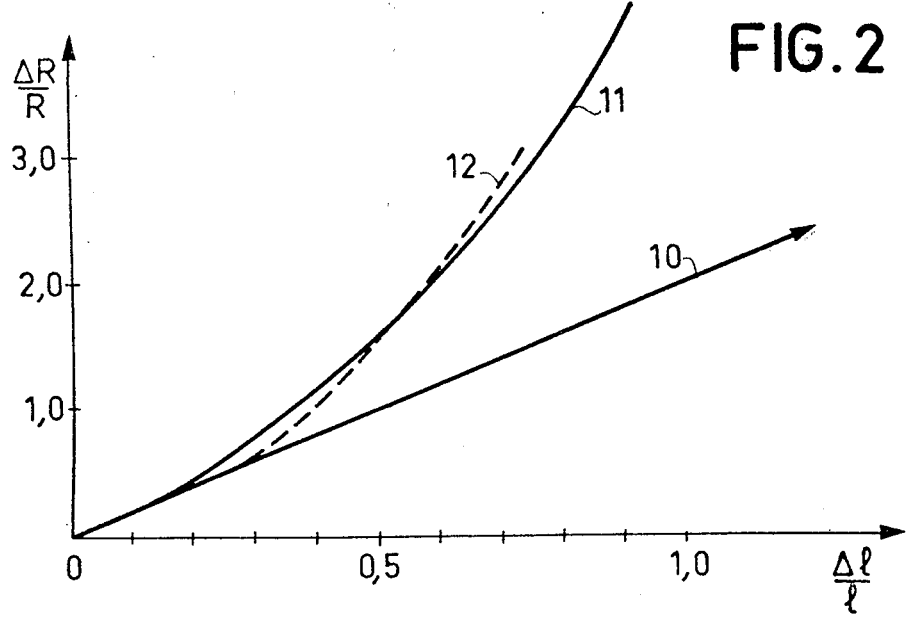
FIGS. 2 and 3 are explanatory diagrams.

In FIG. 2, there is shown in a diagram the proportional elongations $\Delta l/l$ and the relative increases in resistance $\Delta R/R$ for two different compositions of metallic layers 6 and 8. Curve 11 relates the resistance variation $\Delta R/R$ to the proportional elongation $\Delta l/l$ in the case of metalizations formed by the evaporation on each face of film 7 of a 30 Å chromium layer followed by the evaporation of a 500 to 600 Å gold layer. Curve 12 shown by a broken line relates to the case of metalizations formed on each face of film 7 by the thermal evaporation of an aluminium layer of a thickness of 1500 Å.

It can be seen that for small proportional elongations, the slopes of curves 11 and 12 follow the straight line 10 passing through points ($\Delta l/l=0$, $\Delta R/R=0$) and ($\Delta l/l=0.5$, $\Delta R/R=1$). In this stretching range, it may be considered that the variation in resistance of the metalization results from the reversible contraction of the passage section for the measuring current and from the elastic elongation of the path followed by this current. For higher proportional elongations, curves 11 and 12 separate from straight line 10 by curving upwards, which indicates a more rapid increase of $\Delta R/R$ as a function of $\Delta l/l$. This more rapid increase may be explained by the increase in resistivity $\rho$ which characterizes the behavior of thin films and by the formation of microcracks between the elementary grains forming the metal layer.

In the experiment which has just been described, film 7 has a thickness of 25 μm and the whole of the apparatus is placed in a thermostatic controlled enclosure brought up to a temperature of 100° C. This temperature is that at which the shaping of $PVF_2$ is usually carried out. What is remarkable is that the tensile test may continue beyond a proportional elongation of 100% without any sudden interruption of the measuring current being observed. On the other hand, the adherence of the metalizations remains good and the stretched structure retains its shape after removal of the load.

The tensile test whose results are given in FIG. 2 relates to unidirectional stretching along axis XX. To judge the shaping possibilities in the case where the stretching is biaxial, stretching of the structure of FIG. 1 was first of all carried out along axis XX and then along axis YY. Between the two tensile tests, structure 6, 7, 8 was removed and clamped again after being rotated by 90° in its plane.

Figure 3:
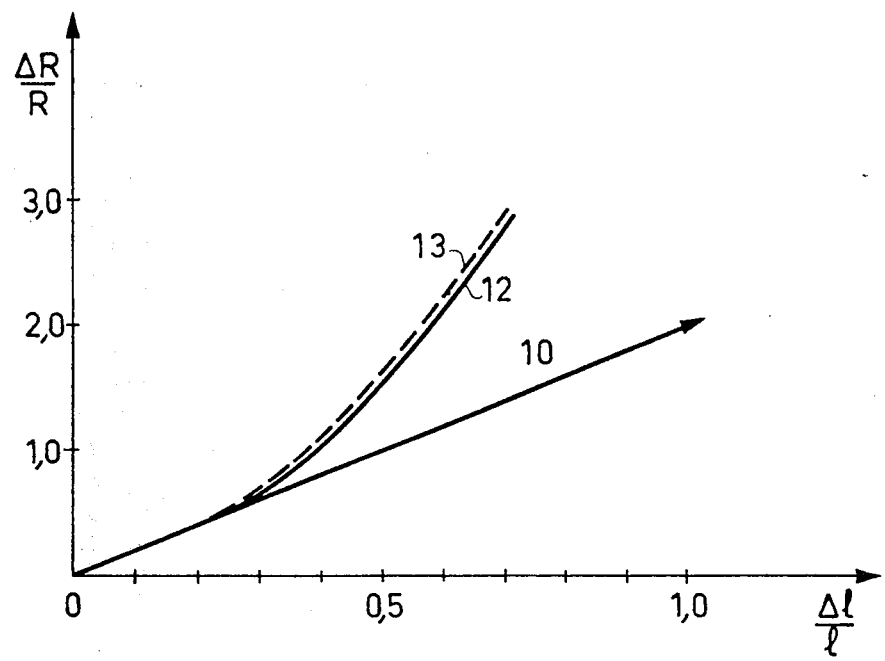

FIG. 3 shows on the same scale as in FIG. 2 the law of variation of the relative increase in resistance $\Delta R/R$ as a function of the proportional elongation $\Delta l/l$. Curve 12 corresponds to the first stretching in direction XX and the broken-line curve 13 relates to the second tensile test along axis YY. These curves are superimposable except for experimental errors. It may be deduced therefrom that shaping comprising biaxial stretching may be considered in a very extended range of proportional elongations. The increase of the electrical resistance remains moderate and is consequently within the scope of transducer systems using electrical fields induced in dielectric materials.

Figure 4:
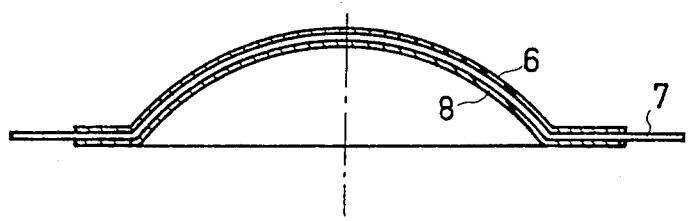
FIG. 4 shows in meridian section a transducer obtained by the process of the invention.
Figure 5:
FIG. 5 is a section of the structure to be shaped.

FIG. 4 shows a piezoelectric transducer element in the shape of a spherical skullcap which comprises a thin polymer film 7 provided with metalizations 6 and 8. FIG. 5 shows the starting structure for shaping the transducer element of FIG. 4. To avoid electrical breakdown by flashover, the dielectric disk 7 extends beyond metalizations 6 and 8. In fact, during shaping, the polymer film is subjected to an electric polarizing field whose intensity is of the order of 1 MV/cm. The voltage to be applied between metalizations 6 and 8 may reach several thousand volts for a distance therebetween of only 25 μm. In the case of FIG. 4, the height of the spherical skullcap is 15 mm for a diameter at the base of 70 mm. The flat metalizations of FIG. 5 have a slightly greater diameter so as to allow peripheral clamping with connection. The average biaxial stretching is in this case close to 11%, i.e. much less than that which the metalizations may withstand before breaking of stripping.

Figure 6:
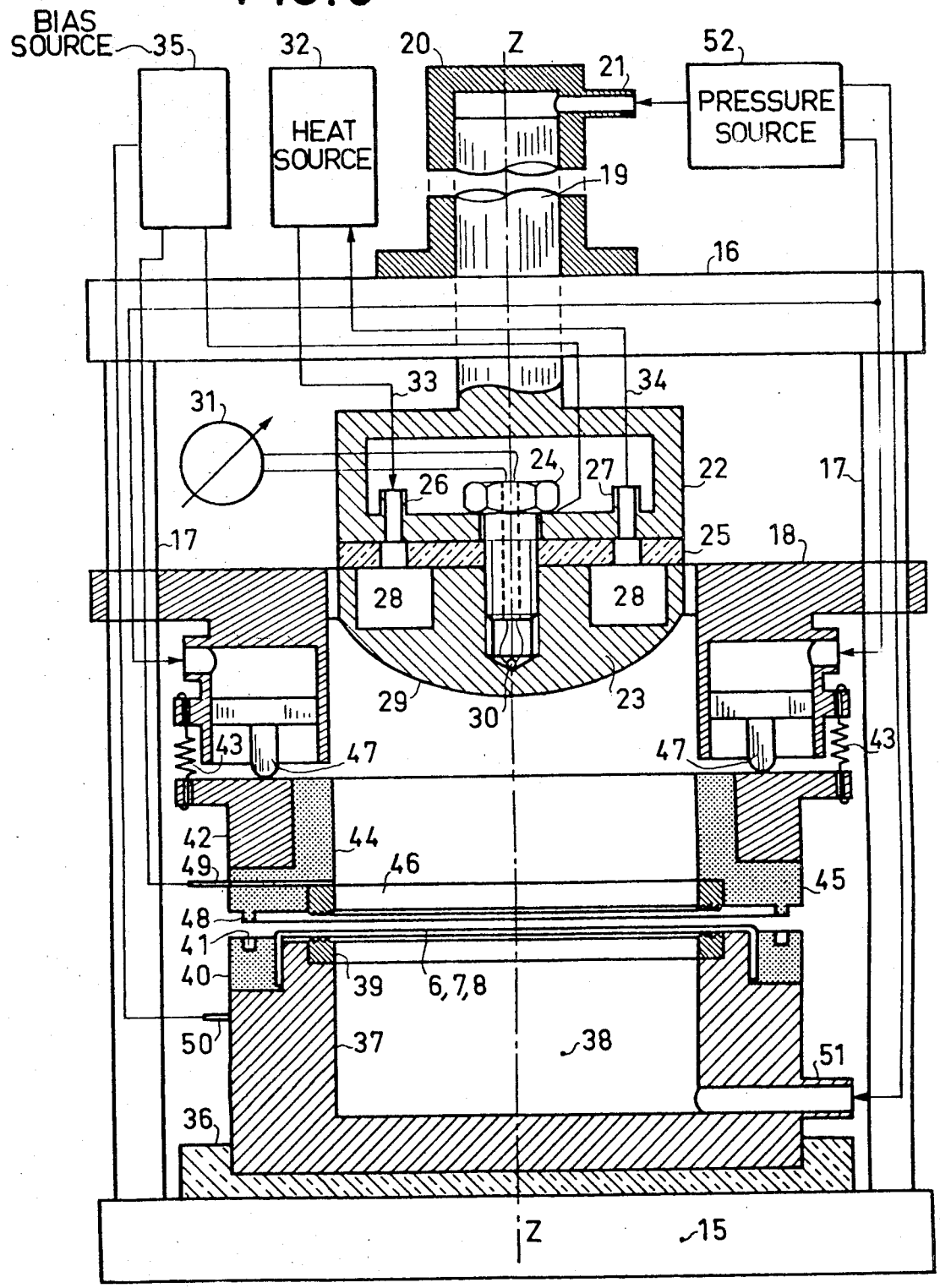
FIG. 6 is a partial view of a shaping device in accordance with the invention.

For shaping the element shown in FIG. 5, the device shown in partial section in FIG. 6 is used.

This device comprises a base 15 connected to an upper table 16 by columns 17. A sliding ring 18 may be locked on columns 17 at a suitable height from base 15. The upper table 16 comprises a central bore in which passes the piston 19 of a hydraulic cylinder-and-piston device 20 having an inlet pipe 21. The lower end of piston 19 is in the form of a hollow cylindrical body 22 on the lower face of which is mounted a punch 23. Punch 23 is fixed to the hollow body 22 by a bolt 24 comprising a central bore. Punch 23 is thermally insulated from hollow body 22 by a seal 25 and so as to avoid a thermal bridge, bolt 24 is made from ethylene polytetrafluoride. The lower face of hollow body 22 is provided with two end-pieces 26 and 27 which communicate with an annular chamber 28 through two holes formed in heat-seal 25. Punch 23 is made from a good heat-conducting metal and its lower polished face 29 corresponds in shape to the nondevelopable form which it is desired to impose on flat structure 6, 7, 8. A thermocouple 30 serves for measuring the temperature of punch 23; it is connected to a millivoltmeter 31 by electrical connections passing through the central bore of bolt 24. The heating of punch 23 is obtained for example by a heat-carrying fluid such as hot air flowing in annular chamber 28. To this end, a heat source 32 is connected by channels 33 and 34 to end-pieces 26 and 27. Hot or cold air may be caused to flow alternately according as to whether it is desired to heat or cool punch 23. An electrical connection, not shown in FIG. 6, exists between body 22 and punch 23. A polarizing voltage generator 35 has its ground terminal connected to hollow body 20 and consequently to punch 23.

The means for the peripheral clamping of structure 6, 7, 8 to be shaped comprise an insulating sole-piece 36 which rests on base 15. The sole-piece 36 carries a metal cup 37 with cylindrical side wall which encloses a cavity 38 sufficiently deep for receiving the lower active part of punch 23. The inner flange of the side wall of cup 37 is provided with a metal ring 39 whose upper face is machined so as to present several concentric grooves with rectangular profile. By way of a nonlimiting example, the grooves of ring 39 have a pitch of 0.5 mm, a width of 0.3 mm and a depth of 0.2 mm. The outer flange of the cylindrical wall of cup 37 has been backed off to house a retaining ring 40 for structure 6, 7, 8. This retaining ring 40 is made from an insulating material and serves for holding in position the folded-down edges of structure 6, 7, 8. The upper face of ring 40 comprises a circular centering groove 41. Above cup 37 there is provided a clamping ring 42. This ring 42 is urged towards ring 18 by means of springs 43. It is lined inwardly with an insulating liner 44 which has a flange 45 completely covering the lower face of ring 42. The inner flange of liner 44 is provided with a conducting ring 46 of the same type as ring 39. Ringed rings 46 and 39 serve as clamping jaws and electrical connection for the metalizations 8 and 6 of the structure to be shaped. Clamping of the structure to be shaped is provided by the thrust exerted by the piston-and-cylinder devices 47 in ring 18. These devices 47 tend to bring ring 42 closer to cup 37. Centering is provided by a circular boss 48 which engages in the circular groove 41. Ring 46 is connected electrically to generator 35 by an electric connection 49. Ring 39 is connected electrically to generator 35 by means of an electrical connection 50, through metal cup 37. The cavity 38 and the lower face of the structure is shaped to be subjected to a hydrostatic counterpressure. To this end, cup 37 is provided with an end-piece 51. A generator 52 supplies through appropriate ducts fluid under pressure to the end-pieces 51, 21 and the piston-and-cylinder devices 47. Ring 18, liner 44 and cavity 38 form a bore in which the punch may move downwards sufficiently far for complete shaping of structure 6, 7, 8.

To illustrate the operation of the device of FIG. 6, there will first of all be described the shaping by punching of a spherical skullcap having for example a half-opening angle of 45°. At the beginning of the operation, punch 23 is raised up as well as ring 18. Punch 23 is brought to the desired temperature for shaping, for example 100° C. The heating results from the flow of the heat-carrying fluid (air, water, glycol, etc.) between the annular chamber 28 and source 32. The temperature is controlled by the thermocouple 30 and the millivoltmeter 31. With ring 42 raised, access may be easily had to cup 37. After having raised holding ring 40, a flat structure such as shown in FIG. 5 is centered over ring 39 and its edges are folded down and ring 40 is replaced. Orifice 51 is vented. Ring 18 may be lowered and locked on colmns 17. By operating the piston-and-cylinder devices 47, firm clamping of structure 6, 7, 8 is provided between jaws 39 and 46 which establishes the electrical connections with metalizations 8 and 6. By operating a piston-and-cylinder device 20, punch 23 is lowered until it comes into contact with the metalization 8 of film 7. Thus, film 7 heats up due to the heat released by the punch. When the heat equilibrium is reached, the polarizing voltage is applied to connection 50 and shaping is begun by a slow descent of punch 23. By way of nonlimiting example, the descent is 2 mm/minute. This descent is interrupted when the whole extent of the structure to be shaped is fitted to the bulging face of the punch. The polarizing voltage is maintained for about 20 minutes and before switching off, the punch is cooled to bring the thermoshaped structure to room temperature. There only remains to raise the punch and release the thermoshaped structure by removing the peripheral clamping and by removing the holding ring 40. The shaping results from the thermoforming by means of the punch and from electroforming coming from the polarizing voltage.

Figure 7:
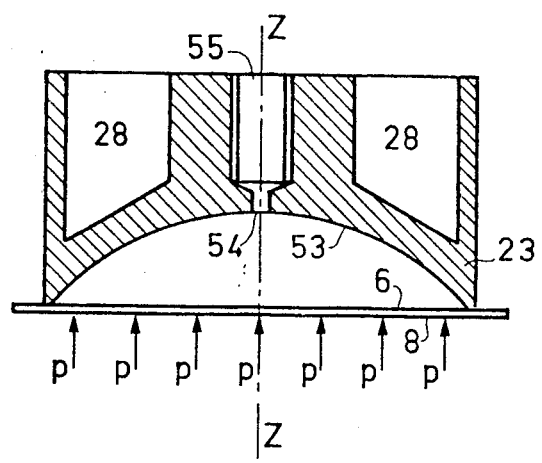
FIG. 7 is a sectional view of another embodiment of the punch of FIG. 6.

In FIG. 7, there is shown a sectional view of a punch 23 for carrying out the shaping of the structure under the action of the hydrostatic thrust p. The lower face 53 of punch 23 is concave and the pole is occupied by a minute orifice 54 which allows the air entrapped between the film to be shaped and the concave face 53 to escape. The operation is the same as before until the punch comes into contact with metalization 6. At that moment, a hydrostatic pressure supplied by source 52 is caused to act in cavity 38. The fluid used may be liquid or gaseous, its role being to cause the structure of FIG. 5 to fit to the concave shape of face 53.

The heating of the film is again provided by a heat-carrying fluid flowing in the annular chamber 28 of the punch, but it is also possible to place a radiating heat source in cavity 38.

When the shaping temperature is reached, the polarizing field is applied and the shaping fluid is injected through end-piece 51 under a pressure reaching a few bars. After the heating time of twenty minutes, the film is cooled under an electric field and the thrust p may be reduced to zero.

A variation of this process consists in letting orifice 51 communicate with the surrounding air and in drawing through orifice 55 the air entrapped between the film and face 53. Thrust p is limited to the value of 1 bar, which is sufficient for forming the dome described in FIG. 4.

The two previously described modes of action may be combined when the shape desired is made from convex and concave parts.

Figure 8:
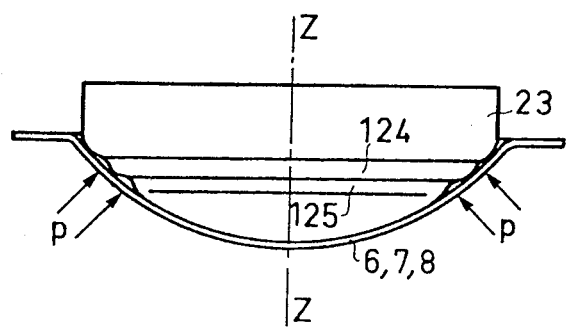
FIG. 8 is a profile view of another embodiment of the punch of FIG. 6.

This case occurs particularly when a dome provided with circumferential corrugations is manufactured. The shape of an appropriate punch is shown in FIG. 8 which shows two peripheral depressions 124 and 125. The general shape is acquired by punching. After this punching, the film is caused to assume the shape of the concave parts 124 and 125 under the action of a hydrostatic thrust exerted in cavity 38 by a liquid or gaseous fluid.

In the preceding shaping methods, punch 23 is alternately heated and cooled, which lengthens the manufacturing time.

Good results may also be obtained while maintaining the punch at a constant temperature. To this end, the upper metalization of the structure to be thermoformed is connected to generator 35 by a connection 49 which allows the polarizing voltage to be applied to the polymer film independently of the fact that the punch is in contact with the structure to be shaped. When the shaping is finished, a depression is created in cavity 38 and the punch is raised, which ensures cooling under an electric field. The shape acquired is retained and because of the depression the film-punch separation is facilitated. This separation causes no switching off of the polarizing electric field during cooling of the shaping structure.

The preparation of the structure of FIG. 5 with a view to the shaping thereof consists in forming metalizations on each face of a polymer film. These metalizations may be obtained by thermal evaporation under a vacuum in two steps. The temperature conditions are different for the second deposit takes place in the presence of the first one which behaves like a mirror. The result is that the shaping properties are not exactly the same for both faces of the polymer film.

It has been noticed in practice that the appearance defects of the shaped structure are absent when it is arranged for the metalization formed in the second place to be turned towards the punch.

To make manufacture more rational, a strip of polymer film may be introduced between jaws 39 and 46. During the descent of the punch, the clamping of the jaws and the cutting out of the structure take place without it being necessary to cut out the flat structures beforehand and to hold them in place one by one by means of ring 40. Before placement between jaws 39 and 46, the strip has received making metalizations which follow one another with a constant pitch. With such adaptations, continuous and automated manufacturing may be envisaged. The means for heating the structure may be reinforced or replaced by, for example, embedding heating resistances in the wall of cup 37 or of punch 23. A heat-carrying fluid may also be caused to flow within the mass of cup 37. In the case of the punching method, cavity 38 may be filled by a heat-carrying liquid or heated by another fluid. This filling liquid may possibly provide an electrical connection with the structure if it is made conducting.

What is claimed is:

1. A process for manufacturing electromechanical transducers using at least one polymer film which is subjected to shaping, said process comprising:
providing two faces of a flat structure comprising said film with similar metalizations intended to form electrodes; and
shaping said flat structure with metalizations thereon to produce a self-supporting and nondevelopable structure by applying a polarizing voltage to said metalizations while carrying out bidirectional stretching so that the mechanical stress permanently increases the surface area of the metalizations carried by said structure.

2. The process as claimed in claim 1, wherein said structure is heated and cooled the shaping occurring within a period of time separating the heating phase from the cooling phase; the polarizing voltage being maintained during the cooling phase.

3. The process as claimed in claim 1, wherein said mechanical stress is exerted on one of the faces of said structure by means of a solid body carrying the impression of the shape to be formed.

4. The process as claimed in claim 3, wherein said stress results from the pressing of nonclamped parts of said structure by means having a rigid frame fitted with clamping jaws.

5. The process as claimed in claim 3, wherein said structure is formed to have a cavity in the other face; a hydrostatic thrust produced by a fluid contained in a cavity forcing said structure against said impression.

6. The process as claimed in claim 5, wherein said fluid contained in said cavity is at atmospheric pressure; the forcing taking place by atmospheric pressure exerted on the face of the impression.

7. The process as claimed in claim 3, wherein separation of the shaped structure and the impression is caused by suction.

8. The process as claimed in claim 3, wherein said flat structure to be shaped is metalized by thermal evaporation in a vacuum at first along the other face and then along said one face; said one face being turned toward the impression of the solid body.

* * * * *